United States Patent
Sriram et al.

(10) Patent No.: US 9,679,981 B2
(45) Date of Patent: Jun. 13, 2017

(54) CASCODE STRUCTURES FOR GAN HEMTS

(71) Applicant: CREE, INC., Durham, NC (US)

(72) Inventors: Saptharishi Sriram, Cary, NC (US);
Terry Alcorn, Cary, NC (US); Fabian Radulescu, Chapel Hill, NC (US);
Scott Sheppard, Chapel Hill, NC (US)

(73) Assignee: CREE, INC., Durham, NC (US)

( * ) Notice: Subject to any disclaimer, the term of this patent is extended or adjusted under 35 U.S.C. 154(b) by 0 days.

(21) Appl. No.: 13/913,490

(22) Filed: Jun. 9, 2013

(65) Prior Publication Data

US 2014/0361341 A1    Dec. 11, 2014

(51) Int. Cl.
| | |
|---|---|
| *H01L 29/778* | (2006.01) |
| *H01L 29/423* | (2006.01) |
| *H01L 29/40* | (2006.01) |
| *H01L 29/20* | (2006.01) |

(52) U.S. Cl.
CPC ...... *H01L 29/42356* (2013.01); *H01L 29/402* (2013.01); *H01L 29/42316* (2013.01); *H01L 29/778* (2013.01); *H01L 29/7787* (2013.01); *H01L 29/2003* (2013.01)

(58) Field of Classification Search
CPC ..... H01L 29/423; H01L 29/778; H01L 29/42; H01L 29/42356; H01L 29/402; H01L 29/42316; H01L 29/77; H01L 29/7787
See application file for complete search history.

(56) References Cited

U.S. PATENT DOCUMENTS

| | | | |
|---|---|---|---|
| 4,290,077 A | 9/1981 | Ronen | 257/409 |
| 4,551,905 A | 11/1985 | Chao et al. | 438/570 |
| 4,766,474 A | 8/1988 | Nakagawa et al. | |
| 4,946,547 A | 8/1990 | Palmour et al. | |
| 4,947,232 A | 8/1990 | Ashida et al. | 357/53 |
| 5,053,348 A | 10/1991 | Mishra et al. | 438/571 |
| 5,187,552 A | 2/1993 | Hendrickson et al. | |
| 5,192,987 A | 3/1993 | Khan et al. | 257/183.1 |
| 5,196,359 A | 3/1993 | Shih et al. | 437/40 |
| 5,200,022 A | 4/1993 | Kong et al. | |

(Continued)

FOREIGN PATENT DOCUMENTS

| | | |
|---|---|---|
| CN | 1242608 A | 1/2000 |
| CN | 1321340 A | 7/2001 |

(Continued)

OTHER PUBLICATIONS

Office Action from U.S. Appl. No. 10/958,945, dated Nov. 14, 2013.

(Continued)

*Primary Examiner* — Fazli Erdem
(74) *Attorney, Agent, or Firm* — Koppel, Patrick, Heybl & Philpott (57) ABSTRACT

A multi-stage transistor device is described. One embodiment of such a device is a dual-gate transistor, where the second stage gate is separated from a barrier layer by a thin spacer layer and is grounded through a connection to the source. In one embodiment the thin spacer layer and the second stage gate are placed in an aperture in a spacer layer. In another embodiment, the second stage gate is separated from a barrier layer by a spacer layer. The device can exhibit improved linearity and reduced complexity and cost.

22 Claims, 3 Drawing Sheets

(56) References Cited

U.S. PATENT DOCUMENTS

| | | | |
|---|---|---|---|
| 5,290,393 A | 3/1994 | Nakamura | 257/488 |
| 5,296,395 A | 3/1994 | Khan et al. | |
| RE34,861 E | 2/1995 | Davis et al. | |
| 5,393,993 A | 2/1995 | Edmond et al. | |
| 5,399,886 A | 3/1995 | Hasegawa | 257/192 |
| 5,470,767 A | 11/1995 | Nakamoto et al. | 438/570 |
| 5,514,992 A | 5/1996 | Tanaka et al. | |
| 5,523,589 A | 6/1996 | Edmond et al. | |
| 5,543,253 A | 8/1996 | Park | 216/12 |
| 5,569,937 A | 10/1996 | Bhatnagar | 257/77 |
| 5,652,179 A | 7/1997 | Strifler et al. | 438/578 |
| 5,686,738 A | 11/1997 | Moustakas | |
| 5,701,019 A | 12/1997 | Matsumoto et al. | 257/192 |
| 5,710,455 A | 1/1998 | Bhatnagar et al. | 257/472 |
| 5,739,554 A | 4/1998 | Edmond et al. | |
| 5,780,900 A | 7/1998 | Suzuki et al. | 257/335 |
| 5,876,901 A | 3/1999 | Ishimaru | 257/28 |
| 5,929,467 A | 7/1999 | Kawai et al. | 257/192 |
| 5,959,307 A | 9/1999 | Nakamura et al. | 257/14 |
| 6,033,948 A | 3/2000 | Kwon et al. | 438/217 |
| 6,057,564 A | 5/2000 | Rennie | 257/99 |
| 6,100,549 A | 8/2000 | Weitzel et al. | 257/194 |
| 6,100,571 A | 8/2000 | Mizuta et al. | 27/95 |
| 6,127,703 A | 10/2000 | Letavic et al. | 257/347 |
| 6,139,995 A | 10/2000 | Burm | 257/27 |
| 6,140,169 A | 10/2000 | Kawai et al. | 438/197 |
| 6,242,766 B1 | 6/2001 | Tateno | 257/194 |
| 6,294,801 B1 | 9/2001 | Inokuchi | 257/192 |
| 6,307,232 B1 | 10/2001 | Akiyama et al. | 257/347 |
| 6,316,793 B1 | 11/2001 | Sheppard et al. | |
| 6,346,451 B1 | 2/2002 | Simpson et al. | 21/331 |
| 6,355,951 B1 | 3/2002 | Hattori | 257/280 |
| 6,445,038 B1 | 9/2002 | Tihanyi | 257/347 |
| 6,468,878 B1 | 10/2002 | Petruzzello et al. | 438/454 |
| 6,475,857 B1 | 11/2002 | Kim | 8/240 |
| 6,483,135 B1 | 11/2002 | Mizuta et al. | 257/283 |
| 6,495,409 B1 | 12/2002 | Manfra et al. | 438/216 |
| 6,548,333 B2 | 4/2003 | Smith | 257/194 |
| 6,559,513 B1 | 5/2003 | Miller et al. | 257/488 |
| 6,586,781 B2 | 7/2003 | Wu et al. | 257/194 |
| 6,586,813 B2 | 7/2003 | Nagahara | 257/472 |
| 6,620,688 B2 | 9/2003 | Woo et al. | 438/262 |
| 6,621,121 B2 | 9/2003 | Baliga | 257/330 |
| 6,624,488 B1 | 9/2003 | Kim | 29/76 |
| 6,627,473 B1 | 9/2003 | Oikawa et al. | 438/46 |
| 6,686,616 B1 | 2/2004 | Allen et al. | 257/280 |
| 6,690,042 B2 | 2/2004 | Khan et al. | 257/192 |
| 6,707,102 B2 | 3/2004 | Morikawa | 257/328 |
| 6,740,535 B2 | 5/2004 | Singh et al. | 438/18 |
| 6,838,325 B2 | 1/2005 | Whelan et al. | 438/172 |
| 6,849,882 B2 | 2/2005 | Chavarkar et al. | |
| 6,870,219 B2 | 3/2005 | Brech | |
| 6,891,235 B1 | 5/2005 | Furukawa et al. | 257/480 |
| 6,902,964 B2 | 6/2005 | Sriram | |
| 6,903,383 B2 | 6/2005 | Yokogawa | 257/192 |
| 6,933,544 B2 | 8/2005 | Saito et al. | 257/194 |
| 6,940,090 B2 | 9/2005 | Saito et al. | 257/20 |
| 6,972,440 B2 | 12/2005 | Singh et al. | 257/194 |
| 7,012,286 B2 | 3/2006 | Inai et al. | 257/192 |
| 7,038,252 B2 | 5/2006 | Saito et al. | 257/192 |
| 7,041,541 B2 | 5/2006 | Behammer | 438/182 |
| 7,071,498 B2 | 7/2006 | Johnson | 257/109 |
| 7,075,125 B2 | 7/2006 | Saito et al. | 257/194 |
| 7,126,426 B2 | 10/2006 | Mishra et al. | 330/307 |
| 7,170,111 B2 | 1/2007 | Saxler | |
| 7,229,903 B2 | 6/2007 | Li et al. | 438/571 |
| 7,230,284 B2 | 6/2007 | Parikh et al. | |
| 7,282,423 B2 | 10/2007 | Furukawa et al. | 438/422 |
| 7,465,967 B2 | 12/2008 | Smith et al. | 257/194 |
| 7,501,669 B2 | 3/2009 | Parikh et al. | 257/194 |
| 7,508,015 B2 | 3/2009 | Saito et al. | 257/192 |
| 7,550,783 B2 | 6/2009 | Wu et al. | 257/194 |
| 7,573,078 B2 | 8/2009 | Wu et al. | |
| 7,679,111 B2 | 3/2010 | Cao et al. | 257/287 |
| 7,800,131 B2 | 9/2010 | Miyamoto et al. | 257/192 |
| 7,812,369 B2 | 10/2010 | Chini et al. | 257/192 |
| 7,863,648 B2 | 1/2011 | Miyamoto et al. | 257/192 |
| 7,964,915 B2 | 6/2011 | Tanaka et al. | 257/341 |
| 8,120,066 B2 | 2/2012 | Lanzieri et al. | 257/194 |
| 8,193,562 B2 | 6/2012 | Suh et al. | 257/194 |
| 8,502,323 B2 | 8/2013 | Chen | 257/392 |
| 8,823,057 B2* | 9/2014 | Sheppard et al. | 257/192 |
| 8,901,604 B2* | 12/2014 | Mishra et al. | 257/170 |
| 2001/0015446 A1 | 8/2001 | Inoue et al. | |
| 2001/0023964 A1 | 9/2001 | Wu et al. | 257/368 |
| 2002/0005528 A1 | 1/2002 | Nagahara | |
| 2002/0017648 A1* | 2/2002 | Kasahara et al. | 257/79 |
| 2002/0033508 A1 | 3/2002 | Morikawa | 257/368 |
| 2002/0105028 A1 | 8/2002 | Fujihira | 257/339 |
| 2002/0137236 A1 | 9/2002 | Schaff et al. | |
| 2002/0137318 A1 | 9/2002 | Peake et al. | |
| 2002/0139995 A1 | 10/2002 | Inoue et al. | 257/194 |
| 2002/0145172 A1 | 10/2002 | Fujishima et al. | |
| 2002/0155646 A1 | 10/2002 | Petruzzello et al. | |
| 2002/0167023 A1 | 11/2002 | Chavarkar et al. | |
| 2003/0006437 A1 | 1/2003 | Mizuta et al. | |
| 2003/0020092 A1 | 1/2003 | Parikh et al. | |
| 2003/0075719 A1 | 4/2003 | Sriram et al. | |
| 2003/0107081 A1 | 6/2003 | Lee et al. | |
| 2003/0132463 A1 | 7/2003 | Miyoshi | |
| 2003/0141518 A1 | 7/2003 | Yokogawa | 257/194 |
| 2003/0183844 A1 | 10/2003 | Yokoyama et al. | |
| 2003/0183886 A1 | 10/2003 | Inoue et al. | |
| 2003/0222327 A1 | 12/2003 | Yamaguchi et al. | |
| 2004/0021152 A1 | 2/2004 | Nguyen et al. | 257/192 |
| 2004/0021175 A1 | 2/2004 | Brech | |
| 2004/0029330 A1 | 2/2004 | Hussain et al. | 438/172 |
| 2004/0124435 A1 | 7/2004 | D'Evelyn et al. | 257/103 |
| 2004/0188775 A1 | 9/2004 | Peake et al. | 257/397 |
| 2004/0201038 A1 | 10/2004 | Kimura et al. | |
| 2004/0227211 A1 | 11/2004 | Saito et al. | |
| 2004/0262629 A1* | 12/2004 | Redd et al. | 257/168 |
| 2005/0051796 A1* | 3/2005 | Parikh | H01L 29/812 257/192 |
| 2005/0051800 A1* | 3/2005 | Mishra | H01L 27/0605 257/202 |
| 2005/0062069 A1 | 3/2005 | Saito et al. | 257/213 |
| 2005/0082611 A1 | 4/2005 | Peake et al. | 257/341 |
| 2005/0110042 A1 | 5/2005 | Saito et al. | |
| 2005/0124100 A1 | 6/2005 | Robinson | 438/167 |
| 2005/0133818 A1 | 6/2005 | Johnson et al. | 257/192 |
| 2005/0170574 A1 | 8/2005 | Sheppard et al. | |
| 2005/0189559 A1 | 9/2005 | Saito et al. | |
| 2005/0208722 A1 | 9/2005 | Peake et al. | 438/259 |
| 2005/0253167 A1 | 11/2005 | Wu et al. | |
| 2005/0253168 A1* | 11/2005 | Wu | H01L 29/7787 257/192 |
| 2006/0006415 A1 | 1/2006 | Wu et al. | 257/194 |
| 2006/0011915 A1 | 1/2006 | Saito et al. | 257/65 |
| 2006/0043416 A1 | 3/2006 | Li et al. | 257/192 |
| 2006/0071247 A1 | 4/2006 | Chen et al. | |
| 2006/0081877 A1 | 4/2006 | Kohji et al. | 257/194 |
| 2006/0108606 A1 | 5/2006 | Saxler et al. | 257/200 |
| 2006/0118809 A1* | 6/2006 | Parikh et al. | 257/103 |
| 2006/0202272 A1* | 9/2006 | Wu | H01L 29/7787 257/355 |
| 2006/0286732 A1 | 12/2006 | Burke et al. | 438/197 |
| 2007/0059873 A1 | 3/2007 | Chini et al. | 438/199 |
| 2007/0102727 A1* | 5/2007 | Twynam | 257/194 |
| 2007/0194354 A1* | 8/2007 | Wu | H01L 29/7787 257/288 |
| 2007/0235755 A1 | 10/2007 | Takei | 257/288 |
| 2007/0235775 A1* | 10/2007 | Wu | H01L 29/404 257/288 |
| 2007/0241368 A1 | 10/2007 | Mil'shtein | 257/192 |
| 2007/0249119 A1* | 10/2007 | Saito | 438/253 |
| 2007/0290762 A1 | 12/2007 | Lin et al. | |
| 2008/0006898 A1 | 1/2008 | Yafune et al. | 257/471 |
| 2008/0067558 A1* | 3/2008 | Kawasaki | 257/263 |
| 2008/0116492 A1* | 5/2008 | Wu | H01L 29/2003 257/213 |
| 2008/0128752 A1 | 6/2008 | Wu et al. | |
| 2009/0032820 A1* | 2/2009 | Chen | 257/76 |
| 2009/0230429 A1* | 9/2009 | Miyamoto et al. | 257/192 |

(56) References Cited

U.S. PATENT DOCUMENTS

| | | | |
|---|---|---|---|
| 2009/0230430 A1* | 9/2009 | Miyamoto et al. | 257/192 |
| 2009/0236635 A1 | 9/2009 | Wu et al. | 257/194 |
| 2010/0025730 A1* | 2/2010 | Heikman | H01L 29/7787 257/194 |
| 2010/0155780 A1 | 6/2010 | Machida | |
| 2010/0201439 A1 | 8/2010 | Wu et al. | 327/581 |
| 2010/0276698 A1 | 11/2010 | Moore et al. | |
| 2010/0314666 A1 | 12/2010 | Saito et al. | |
| 2011/0241020 A1* | 10/2011 | Saunier | H01L 21/8252 257/77 |
| 2011/0260217 A1 | 10/2011 | Okamoto | |
| 2012/0049973 A1 | 3/2012 | Smith et al. | |
| 2012/0104408 A1 | 5/2012 | Imada | 257/76 |
| 2012/0132959 A1 | 5/2012 | Parikh et al. | 257/194 |
| 2012/0175679 A1* | 7/2012 | Marino et al. | 257/194 |
| 2012/0194276 A1 | 8/2012 | Fisher | |
| 2012/0218783 A1 | 8/2012 | Imada | 363/37 |
| 2012/0235156 A1 | 9/2012 | Kuraguchi | 257/76 |
| 2012/0261720 A1 | 10/2012 | Puglisi et al. | 257/194 |
| 2013/0062667 A1 | 3/2013 | Chini et al. | 257/195 |
| 2013/0069115 A1 | 3/2013 | Nakazawa | |
| 2013/0069117 A1* | 3/2013 | Yoshioka et al. | 257/194 |
| 2013/0083567 A1 | 4/2013 | Imada | 363/37 |
| 2013/0175544 A1 | 7/2013 | Oishi | |
| 2013/0193485 A1* | 8/2013 | Akiyama et al. | 257/194 |
| 2013/0292699 A1* | 11/2013 | Ueno | H01L 29/778 257/76 |
| 2014/0001478 A1* | 1/2014 | Saunier et al. | 257/76 |
| 2014/0061659 A1 | 3/2014 | Teplik et al. | 257/76 |
| 2014/0175453 A1* | 6/2014 | Yamada | 257/76 |
| 2014/0239346 A1* | 8/2014 | Green | H01L 27/0629 257/192 |
| 2014/0264360 A1 | 9/2014 | Huang et al. | 257/76 |
| 2014/0353720 A1* | 12/2014 | Inoue et al. | 257/192 |
| 2014/0361341 A1 | 12/2014 | Sriram et al. | 257/194 |
| 2014/0361343 A1 | 12/2014 | Sriram | 257/194 |

FOREIGN PATENT DOCUMENTS

| | | | |
|---|---|---|---|
| CN | 1321340 | 11/2001 | |
| CN | 1428870 A | 7/2003 | |
| CN | 1639875 A | 7/2005 | |
| EP | 0069429 | 1/1983 | |
| EP | 0792028 A2 | 6/1997 | |
| EP | 0792028 | 8/1997 | |
| EP | 1336989 | 8/2003 | |
| EP | 1336989 A2 | 8/2003 | |
| JP | 03035536 | 2/1991 | |
| JP | 05021793 A | 1/1993 | |
| JP | 06349859 | 12/1994 | |
| JP | 6349859 | 12/1994 | 21/338 |
| JP | 6349859 A1 | 12/1994 | |
| JP | 07038108 | 2/1995 | |
| JP | 07050413 | 2/1995 | |
| JP | 07176544 | 7/1995 | |
| JP | 09232827 | 9/1997 | |
| JP | H09232827 | 9/1997 | |
| JP | 11008256 | 1/1999 | |
| JP | H118256 | 1/1999 | |
| JP | 1197455 | 4/1999 | |
| JP | 11233525 | 8/1999 | |
| JP | 11274174 | 10/1999 | |
| JP | 2000003919 | 1/2000 | |
| JP | 2000082671 | 3/2000 | |
| JP | 2000100831 A | 4/2000 | |
| JP | 2000174260 | 6/2000 | |
| JP | 2001094091 | 4/2001 | |
| JP | 2001160656 | 6/2001 | |
| JP | 2001189324 | 7/2001 | |
| JP | 2002016245 | 1/2002 | |
| JP | 2006450212 | 1/2002 | |
| JP | 2002094054 | 3/2002 | |
| JP | 2002100642 | 4/2002 | |
| JP | 2002118122 | 4/2002 | |
| JP | 2000270620 | 9/2002 | |
| JP | 2002270830 A | 9/2002 | |
| JP | 2002343814 | 11/2002 | |
| JP | 2002094054 A | 3/2003 | |
| JP | 2003100775 | 4/2003 | |
| JP | 2003188189 | 7/2003 | |
| JP | 2003203923 | 7/2003 | |
| JP | 2003203923 A | 7/2003 | |
| JP | 2003297854 | 10/2003 | |
| JP | 2003297854 A | 10/2003 | |
| JP | 2005507174 | 3/2005 | |
| JP | 2005093864 | 4/2005 | |
| JP | 2005527102 A | 9/2005 | |
| JP | 200553513 | 11/2005 | |
| JP | 2005340417 | 12/2005 | |
| JP | 2007019560 | 1/2007 | |
| JP | 2010278333 | 12/2010 | |
| TW | 334632 B | 6/1998 | |
| TW | 552712 B | 9/2003 | |
| TW | 579600 B | 3/2004 | |
| TW | I2230978 B | 4/2005 | |
| WO | WO 9908323 | 2/1999 | |
| WO | WO 02093650 | 11/2002 | |
| WO | WO 03036729 | 5/2003 | |
| WO | WO 03036729 A1 | 5/2003 | |
| WO | WO 03038905 A2 | 5/2003 | |
| WO | WO 2004068590 | 8/2004 | |
| WO | WO 2004068590 A1 | 8/2004 | |
| WO | WO 2005114743 | 1/2005 | |
| WO | WO 2006025971 | 7/2005 | |
| WO | WO 2006025971 | 3/2006 | |

OTHER PUBLICATIONS

Response to OA from U.S. Appl. No. 10/958,945, filed Jan. 10, 2014.

Second Office Action from Chinese Patent Appl. No. 201110265486.8, dated Mar. 13, 2014.

Notice of Reasons for Rejection from Japanese Patent Appl. No. 2007-513167, dated Feb. 4, 2014.

Appeal Decision from Japanese Patent Appl. No. 2007-513155, dated Mar. 11, 2014.

Office Action from U.S. Appl. No. 13/355,766, dated Mar. 5, 2014.

Office Action from U.S. Appl. No. 13/245,579, dated Mar. 13, 2014.

Office Action from U.S. Appl. No. 10/958,945, dated Mar. 31, 2014.

Decision from Taiwanese Patent Appl. No. 095103561 dated Mar. 31, 2014.

Pretrial Examination Communication from Japanese Patent Appl. No. 2008-500703, Appeal No. 2013-05298, dated Jun. 3, 2013.

Office Action from U.S. Appl. No. 10/958,945, dated May 15, 2013.

Response to Office Action U.S. Appl. No. 10/958,945, dated Mar. 14, 2013.

Office Action from U.S. Appl. No. 10/958,945, dated Mar. 14, 2013.

Office Action from U.S. Appl. No. 12/497,468, dated Mar. 12, 2013.

Response to Office Action U.S. Appl. No. 12/497,468, dated Nov. 20, 2012.

Office Action from U.S. Appl. No. 12/497,468, dated Nov. 20, 2012.

Office Action from U.S. Appl. No. 13/245,579, dated Jan. 31, 2013.

Office Action from U.S. Appl. No. 13/072,449, dated Dec. 13, 2012.

Response to Office Action U.S. Appl. No. 13/072,449, filed Feb. 13, 2013.

Office Action from U.S. Appl. No. 11/078,265, dated Apr. 28, 2014.

First Office Action from Chinese Patent Appl. No. 2011102654868, dated Jun. 19, 2013.

Notice of Reasons for Rejection from Japanese Patent Appl. No. 2007-513132, dated Jun. 25. 2013.

Office Action from Japanese Patent Appl. No. 2008-500703, dated Jun. 25, 2013.

A.J. Bergsma, "A Comprehensive Design Method for Dual Gate MOSFET Mixers", Ottawa Carleton Institute for Electrical Engineering, Dept. of Electronics, Carleton University, Ottawa, Canada. May 1995. © 1998 AJ Bergsma.

(56) References Cited

OTHER PUBLICATIONS

Vetury, et al., "Performance and RF Reliability of GaN—ON—SiC HEMTs Using Dual-Gate Architectures", Air Force Research Laboratory, Jul. 2006, Air Force Contract No. FA8650-05-C-5411, Wright-Patterson Air Force Base, OH 45433-7750.
Office Action from Japanese Patent Appl. No. 2013-050780, dated Jul. 1. 2014.
Third Office Action from Chinese Patent Appl. No. 200580014868.6, dated Jul. 2, 2014.
Further Examination on European Patent Appl. No. 04 788 624.9, dated Aug. 5, 2014.
Decision of Patent Grant and Allowed Claims from Japanese Patent Appl. No. 2007-513167, dated Aug. 5. 2014.
International Search Report and Written Opinion from PCT/US2014/037728, dated Aug. 18, 2014.
Interrogation from Japanese Patent Application No. 2007-513155, dated Jun. 25, 2013.
Decision of Rejection from Japanese Patent appl. No. 2007-513167, dated Jul. 4, 2013.
Office Action from Taiwanese Patent Appl. No. 095103561, dated Jun. 27, 2013.
International Search Report and Written Opinion from Appl. No. PCT/US2014/641171, dated Sep. 22, 2014.
R. Vetury, et al., "Performance and RF Reliability of GaN-on-SiC HEMT's using Dual-Gate Architectures", RF Micro Devices, Charlotte, NC, 28269, p. 714.
Office Action from U.S. Appl. No. 13/355,766, dated Jul. 30, 2014.
Office Action from Taiwanese Patent Appl. No. 101131917, dated Jul. 26. 2013.
Examination Report from European Patent Appl. No. 06 718 166.9, dated Aug. 13, 2013.
Office Action from U.S. Appl. No. 10/958,945, dated Aug. 16, 2013.
Office Action from U.S. Appl. No. 11/078,265, dated Aug. 15, 2013.
Office Action from U.S. Appl. No. 13/355,766, dated Aug. 9, 2013.
Office Action from U.S. Appl. No. 13/245,579, dated Oct. 25, 2013.
Notice of Reasons for Rejection for Japanese Patent Appl. No. 2007-513167, dated Jan. 9. 2013.
Notice of Reasons for Rejection for Japanese Patent Appl. No. 2007-513167, dated Jan. 9, 2013.
European Search Report from European Patent Application No. 12171403.4-2203/2515339, dated Nov. 12, 2012.
European Search Report from European Patent Application No. 12171401.8-2203/2515338, dated Nov. 13, 2012.
Decision of Rejection from Japanese Patent Application No. 2008-500703, dated Nov. 20, 2012.
Decision of Rejection from Japanese Patent Application No. 2007-513155, dated Nov. 13, 2012.
Examination Report for European Patent Application No. 05756258.9 dated Dec. 11, 2012.
Office Action from Taiwanese Patent Application No. 094111532, dated Nov. 23, 2012.
Interrogation from Japanese Patent Application No. 2007-513132, dated Sep. 25, 2012.
Office Action and Search Report from Taiwanese Patent Application No. 093127333, dated Jul. 5, 2012.
Office Action and Search Report from Taiwanese Patent Application No. 095103561, dated Jul. 24, 2012.
Office Action from Taiwanese Patent Application No. 094114829, dated May 29, 2012.
Summary of Decision of Rejection for Japanese Application No. 2007-513132, dated Mar. 13, 2012.
Decision of Rejection from Taiwanese Application No. 094111532, dated Apr. 11, 2012.
"High Power Density and Low Distortion InGaP Channel FET's with Field-Modulating Plate", Wakejima, et al., IEICE Trans Electron, vol. E85-C, No. 12, Dec. 2002, pp. 2041-2045.
"Very high voltage AlGaN/GaN high electron mobility transistors using a field plate deposited on a stepped insulator", Karmalker, et al., Solid-State Electronics 45 (2001) pp. 1645-1652.

Extended European Search Report from Appl. No. 11183396-8-2203/2432021, dated: Feb. 22, 2012.
Extended European Search Report from Appl. No. 11183404.0-2203, dated: Feb. 28, 2012.
Examiner's Report from Canadian Appl. No. 2566361, Dated: Feb. 7, 2012.
Extended European Search Report from Application No. 11183655.7-2203. dated: Mar. 1, 2012.
Examiner's Report for Canadian Patent Application No. 2,566,756, dated Feb. 16, 2012.
Examiner's Report for Canadian Patent Application No. 2,564,955, dated Feb. 24, 2012.
Summary of "Notice of Reasons for Rejection", Japanese Patent Application No. 2008-500703, dated Jan. 10, 2012.
Summary of "Notice of Reasons for Rejection", Japanese Patent Application No. 2007-238147, dated Jan. 24, 2012.
Office Action from U.S. Appl. No. 10/786,755, dated Jun. 22, 2011.
Office Action from U.S. Appl. No. 11/807,701, dated May 18, 2010.
Office Action from U.S. Appl. No. 11/807,701, dated Jan. 26, 2010.
Office Action from U.S. Appl. No. 12/321,493, dated Aug. 18, 2010.
Office Action from U.S. Appl. No. 12/321,493, dated Jun. 23, 2011.
Office Action from U.S. Appl. No. 12/321,493, dated Jan. 26, 2011.
Office Action from U.S. Appl. No. 12/437,505, dated Jul. 21, 2010.
Office Action from U.S. Appl. No. 12/497,468, dated Aug. 18, 2011.
Office Action from U.S. Appl. No. 12/497,468, dated Mar. 7, 2011.
Office Action from U.S. Appl. No. 10/958,945, dated Sep. 23, 2011.
Office Action from U.S. Appl. No. 10/958,945, dated Apr. 1, 2011.
Office Action from U.S. Appl. No. 10/958,945, dated Sep. 1, 2010.
Office Action from U.S. Appl. No. 10/958,945, dated Jan. 28, 2010.
Office Action from U.S. Appl. No. 11/078,265, dated Jun. 15, 2011.
Office Action from U.S. Appl. No. 11/078,265, dated Jan. 20, 2010.
Office Action from U.S. Appl. No. 11/600,617, dated Dec. 22, 2009.
Office Action from U.S. Appl. No. 11/584,135, dated Jun. 15, 2011.
Office Action from U.S. Appl. No. 11/901,103, dated Feb. 11, 2011.
Office Action from U.S. Appl. No. 11/901,103, dated Jun. 8, 2010.
European Examination Report Application No. 05731252.2-2203 Dated: Jul. 30, 2008.
First Office Action from China, Application No. 200480032782.1, Dated Jul. 18, 2008.
Saito, et al., "Theoretical limit estimation of lateral wide band-gap semiconductor power-switching device", Solid-State Electronics 48 (2004), pp. 1555-1562.
International Search Report, PCT/JP03/00843, dated Mar. 28. 2003.
Second Office Action from related China Application No. 200580015278.5, Dated: Dec. 19, 2008.
Communication Pursuant to Article 94(3) EPC re: related European Application No. 07018026.0.
Patent Abstracts of Japan, Pub. No. 07176544, Pub. Date: Jul. 14, 1995.
Official Notice of Final Decision of Rejection re Japan Patent App. No. 2006-526270, Dated: Jan. 23, 2009.
First Examination Report from related European Appl. No. 04 788 642.9-2203.
Second Office Action from related Chinese Appl. No. 200480032782.1, dated: Dec. 28, 2009.
Office Action from related U.S. Appl. No. 11/078,265, dated Jan. 20, 2010.
Office Action from related U.S. Appl. No. 11/807,701, dated Jan. 26, 2010.
Notification of Rejection/Objection for Chinese Patent Appl. No. 200580014868.6, dated Aug. 11, 2010.
Office Action for European Patent Appl. No. 05735109.0 dated Aug. 27, 2010.
Extended Search Report for European Patent Appl. No. 10183441.4 dated Nov. 24, 2010.
Extended Search Report for European Patent Appl. No. 10183607.0 dated Nov. 29, 2010.
Notice Requesting Submission of Opinion in counterpart Korean Patent Appl. No. 10-2006-7004682, dated Feb. 17, 2011.
PCT International Preliminary Report for Group related Applications, Appl. No. PCT/US05/09984, dated Aug. 25, 2008.
Office Action from European Patent Appl. No. 05756258.9, Jun. 10, 2010.

(56) References Cited

OTHER PUBLICATIONS

Wu et al. "High Al Content AlGaN/GaN HEMTs With Very High Performance", IEDM 1999 Digest pp. 925-927, Washington, D.C. Dec. 1999.
IEEE Transactions on Electron Devices, vol. 48, No. 3 Mar. 2001, p. 581-585.
Kahn et al.. "AlGaN/GaN Metal-Oxide-Semiconductor Heterostructure Field-Effect Transistors on SIC Substrates", Applied Physics Letters, American Institute of Physics, New York, US, vol. 77, No. 9, Aug. 2000, p. 1339-1341, XP000951319 ISSN: 0003-6951.
Lu et al. "P-Type SiGe Transistors With Low Gate Leakage Using SIN Gate Dielectric", IEEE Electron Device Letters, IEEE, Inc., New York, US, vol. 20, No. 10, Oct. 1999 (Oct. 1999), p. 514-516, XP000890470, ISSN: 0741-3106.
Zhang N-Q et al., "High Breakdown GAN HEMT With Overlapping Gate Structure", IEEE Electron Device Letters, IEEE, Inc. New York, US, vol. 9, Sep. 2000 (Sep. 2000), p. 373-375, XP000954354, ISSN: 0741-3106.
Third Office Action from related Chinese Application No. 200580014866.7, dated: Oct. 30, 2009.
Chinese Patent Appl. No. 200580014868.6, second Office Action dated Feb. 24, 2010.
Examiner's First Report on Patent Appl. Re related Australian Appl. No. 2005246697, dated Mar. 19, 2010.
International Search Report, PCT/US05/26064, dated: Jan. 6, 2006.
International Search Report, PCT/US98/16295, dated: Dec. 15, 1998.
International Search Report, PCT/US2005/012821, dated Mar. 29, 2006.
First Office Action re related Chinese Application No. 200580015278.5, Dated: May 9, 2008.
Office Action for Korean Patent Appl. No. 10-2006-7026207, mailed Jul. 26, 2011.
Office Action for Taiwan Patent Appl. No. 094111532, dated Jul. 4, 2011.
Extended Examination Report for European patent Appl. No. EP05731252.2, May 5, 2011.
Office Action for Taiwan Patent Appl. No. TW09312733, Apr. 29, 2011.
Office Action for Korean Patent Appl. No. KR 10-2006-7026090, May 17, 2011.
Japanese Patent Application No. 2003-081849 (Laid-open No. 2004-289038) Patent Abstracts of Japan.
Official Notice of Rejection mailed on Jun. 24, 2008, Japanese Patent Application No. 2006-526270 and comments.
Japanese Patent Application Laid-open No. 2001230407 Patent Abstracts of Japan.
Japanese Patent Application Laid-open No. 2002-343814 Patent Abstracts of Japan.
Japanese Patent Application Laid-open No. 63-087773 Patent Abstracts of Japan.
Japanese Patent Application Laid-open No. 2001-230263 Patent Abstracts of Japan.
Japanese Patent Application No. 2003-307916 (Laid-open No. 2005-079346) Patent Abstracts of Japan.
CRC Press, *The Electrical Engineering Handbook*, Second Edition, Dorf, (1997) p. 994.
B. Belmont, K. Kim, and M. Shur, "Monte Carlo Simulation of Electron Transport in Gallium Nitrate," *Journal of Applied Physics*, vol. 74, Issue 3. (Aug. 1, 1993) p. 1818.
R. Gaska, J.W. Yang, A. Osinsky, Q. Chen, M.A. Khan, A.O. Orlov, G.L. Snider, M.S. Shur, "Electron Transport in ALGaN Heterostructures Grown on 6H-SiC Substrates," *Applied Physics Letters*, vol. 72, No. 6 (Feb. 9, 1998) p. 707.
Y. F. Wu et. al. "GaN-Based FETs for Microwave Power Amplification." *IEICE Transactions on Electronics*, E-82-C, (1999) p. 1895.

Y.F. Wu, D. Kapolnek, J.P. Ibettson, P. Parikh, B.P. Keller, and U.K. Mishra, "Very-High Power Density ALGaN/GaN HEMTs." *IEEE Transactions on Electronic Devices*, vol. 48, Issue 3 (Mar. 2001) p. 586.
M. Micovic, A. Kurdoghlian, P. Janke, P. Hashimoto, D.W.S. Wong, J. S. Moon, L. McRay, and C. Nguyen, "ALGaN/GaN Heterojunction Field Effect Transistors Grown by Nitrogen Plasma Assisted Molecular Beam Epitaxy." *IEEE Transactions on Electronic Devices*, vol. 48, Issue 3, (Mar. 2001) p. 591.
Gaska et al., "High Temperature Performance of ALGAN/GaN HFET's on SiC Substrates." *IEEE Electron Device Letters* vol. 18, No. 10, (Oct. 1997) p. 492.
Ping et al.. "DC and Microwave Performance of High Current ALGaN Heterostructure Field Effect Transistors Grown on P-Type SiC Substrates," *IEEE Electron Device Letters* vol. 19, No. 2, (Feb. 1998) p. 54.
L. Eastman, K. Chu, J. Smart, J. R. Shealy, "GaN Materials for High Power Microwave Amplifiers," *Materials Research Society* vol. 512 Wocsemmad, Monterey, CA (Feb. 1998) p. 3-7.
G. Sullivan et al., "High Power 10-GHz Operation of ALGaN HFET's in Insulating SiC," *IEEE Electron Device Letters* vol. 19, No. 6, (Jun. 1998) p. 198.
Wu et al., "High AL-Content ALGaN/GaN MODFETs for Ultrhigh Performance." IEEE *Electron Device Letters* vol. 19, No. 2, (Feb. 1998) p. 50.
Y. Ando, at al., "10-W/mm ALGaN—GaN HFET With a Field Modulating Plate," *IEEE Electron Device Letters* vol. 24, No. 5, (May 2003) p. 289-292.
S. Karkmucar, U.K. Mishra, "Very High Voltage ALGaN/GaN High Electron Mobility Transistors Using a Field Plate Deposited on a Stepped Insulator," *Solid-State Electronics* vol. 45, (2001) 1645-1652.
W. Saito et al., "600V ALGaN/GaN Power-HEMT: Design, Fabrication and Demonstration on High Voltage DC-DC Converter," *IEEE IEDM* vol. 23, No. 7, (2003) pp. 587-590.
Wu et al., "High-Gain Microwave GAN HEMTs With Source-Terminated Field-Plates", Cree Santa Barbara Technology Center.
Wu et al., "30-W/MM GAN HEMTs by Field Plate Optimization", IEEE, vol. 25, No. 3, Mar. 2004, p. 117-119.
Saito et al. Solid State Electronics, Theoretical Limit Estimation of Lateral Wide Bandgap Semiconductor Power-Switching Device Apr. 1, 2003, p. 1555-1562.
Tilak, et al., "Effect of Passivation on AlGaN/GaN HEMT Device Performance" 2000 IEEE International Symposium on Compound Semiconductors. Proceedings of the IEEE $27^{th}$ International Symposium on Compound Semiconductors (Cat. No. $00^{th}$ 8498), 2000 IEEE International Symposium on Compound Semiconductors Proceedings of the, p. 357-363, XP002239700, 2000 Piscataway, NJ, USA, IEEE, US ISBN: 0-7803-6258-6.
Office Action from related family, U.S. Appl. No. 11/807,701, dated Aug. 22, 2008.
Office Action from related family, U.S. Appl. No. 10/958,970, dated Sep. 10, 2008.
Saito et al. "High Breakdown Voltage AlGaN—GaN Power HEMT Design and High Current Density Switching Behavior", IEEE Transactions on Electron Devices, vol. 50, No. 12, Dec. 2003, pp. 2528-2531.
Heikman et al. "Growth of Fe Doped Semi-Insulating GAN by Metalorganic Chemical Vapor Deposition" Applied Physics Letters, vol. 81, No. 3, Jul. 2002, pp. 439-441.
Heikman, Growth and Characteristics of Fe-Doped GAN, Journal of Crystal Growth 248 (2003), 513-517.
Asano K et al: "Novel High Power AlGaAs/GaAs HFET With a Field-Modulating Plate Operated at 35 V Drain Voltage", Electron Devices Meeting, 1998, IDM '98 Technical Digest, International San Francisco, CA USA Dec. 6-9, 1998, Piscataway, NJ, USA IEEE US, Dec. 6, 1998, pp. 59-62.
Wakejima A et al, "High Power Density and Low Distortion Ingap Channel FETs With Field-Modulating Plate", IEICE Transactions on Electronics, Institute of Electronics Information and Comm. Eng. Tokyo, JP, vol. E85-C, No. 12, Dec. 2002, pp. 2041-2045, XP001161324.

(56) References Cited

OTHER PUBLICATIONS

Mok P K T et al, "A Novel High-Voltage High-Speed MESFET Using a Standard GAAS Digital IC Process" IEEE Transactions on Electron Devices, IEEE Inc. New York, US, vol. 41, No. 2. Feb. 1, 1994, pp. 246-250, XP000478051.
Li J. et al "High Breakdown Voltage GaN HFET With Field Palte" Electronics Letters, IEE Stevenage, GB vol. 37, No. 3, Feb. 1, 2001, pp. 196-197, XP006016221.
Xing H. et al. "High Breakdown Voltage AlGaN—GaN HEMTs Achieved by Multiple Field Plates" IEEE Electron Device Letters, IEEE Inc. New York, US, vol. 25, No. 4, Apr. 2004, pp. 161-163.
Saito et al. "Design and Demonstration of High Breakdown Voltage GaN High Electron Mobility Transistor (HEMT) Using Field Plate Structure for Power Electronics Applications" Japanese Journal of Applied Physics, Japan Society of Applied Physics, Tokyo, JP vol. 43, No. 4B, Apr. 2004 pp. 2239-2242, XP001227744, ISSN: 0021-4922.
Examination Report from Canadian Patent Appl. No. 2,566,756, dated Nov. 7. 2013.
European Search Report from European Patent Appl. No. 12180744.0-1552, dated Dec. 12, 2013.
Examination Report from Canadian Patent Appl. No. 2,564,955, dated Dec. 6, 2012.
Notice of Reasons for Rejection from Japanese Patent Appl. No. 2008-500703, dated Nov. 12, 2013.
Reason for Rejection from Japanese Patent Appl. No. 2012-157890, dated Dec. 24, 2013.
European Search Report from European Patent Appl. No. EP 2 538 446 A3, Published Jan. 15, 2014.
Reasons for Rejection from Japanese Patent Appl. No. 2012-107672, dated Dec. 24, 2013.
Reasons for Rejection from Japanese Patent Appl. No. 2012-117726, dated Dec. 24, 2013.
Fourth Office Action from Chinese Patent Appl. No. 201110265486.8, dated Apr. 15, 2015.
Examination from Canadian Patent Appl. No. 2,564,955, dated Apr. 7, 2015.
Decision of Rejection from Japanese Appl. No. 2012-157890, dated Oct. 21, 2014.
Office Action from Taiwanese Patent Appl. No. 101124701, dated Oct. 14, 2014.
Office Action from Japanese Patent Appl. No. 2012-107672, dated Nov. 11, 2014.
Office Action from Japanese Patent Appl. No. 2013-050780, dated Dec. 9, 2014.
Office Action and Search Report from Taiwanese Appl. No. 102102725, dated Dec. 8, 2014.
J. Li, et al., "High Breakdown Voltage GaN HFET with Field Plate", Electronic Letters, Feb. 1, 2001: vol. 37, No. 3.
Office Action from Taiwanese Patent Appl. No. 101137523, dated Dec. 31, 2014.
Examiner Report from Canadian Patent Appl. No. 2,566,361, dated Feb. 4, 2015.
Decision of Rejection from Japanese Patent Application No. 2012-117726, dated Jan. 27, 2015.
Zhang, et al., "High Breakdown GaN HEMT with Overlapping Gate Structure", IEEE Electron Device Letters, vol. 21, No. 9, Sep. 2000.
Office Action from U.S. Appl. No. 11/078,265, dated Dec. 29, 2014.
Office Action from U.S. Appl. No. 13/929,487, dated Dec. 29, 2014.
Office Action from U.S. Appl. No. 10/958,945, dated Dec. 31, 2014.
Office Action from U.S. Appl. No. 14/025,478, dated Jan. 21, 2015.
Office Action from U.S. Appl. No. 13/355,766, dated Feb. 13, 2015.
Notice of Allowance from Taiwanese Patent Appl. No. 101124701, dated Mar. 2, 2015.
Fourth Office Action from Chinese Patent Appl. No. 200580014868.6 dated Feb. 15, 2015.
Notice of Allowance from Taiwanese Patent Appl. No. 095103561, dated Feb. 17, 2015.
Intention to Grant from European Patent Appl. No. 07016026.0-1552, dated Mar. 25, 2015.
Office Action from Japanese Patent Appl. No. 2012-157890, dated Apr. 22, 2015.
Notice of Allowance from Japanese Patent Appl. No. 2013-050780, dated Apr. 28, 2015.
Reasons for Rejection from Japanese Patent Appl. No. 2014-126655, dated May 26, 2015.
Office Action from Japanese Patent Appl. No. 2012-107672, dated Jun. 9, 2015.
Office Action from U.S. Appl. No. 11/078,265, dated Apr. 1, 2015.
Office Action from U.S. Appl. No. 10/956,945, dated May 1, 2015.
Office Action from Taiwanese Patent Appl. No. 102102725, dated May 18, 2015.
Decision to Grant from European Patent Appl. No. 07018026.0, dated Aug. 6, 2015.
Office Action from U.S. Appl. No. 13/929,487, dated Jun. 3, 2015.
Office Action from U.S. Appl. No. 13/355,766, dated Jun. 22, 2015.
Saito, et al. "Design and Demonstration of High Breakdown Voltage GAN High Electron Mobility Transistor (HEMT) Using Field Plate Structure for Power Electronics Applications", Japanese Journal of Applied Physics, Japan Society of Applied Physics, Tokyo, JP, vol. 43, No. 4B, Apr. 2004, pp. 2239-2242, XP001227744, ISSN: 0021-4922.
Saito, et al, "Theoretical Limit Estimation of Lateral Wide Bandgap Semiconductor Power-switching Device", Solid State Electronics, Elsevier Science Publishers, Barking, GP, vol. 48, No. 9, Apr. 23, 2004, pp. 1555-1562, XP004518805, ISSN: 0038-1101.
Notice of Allowance from Taiwanese Patent Appl. No. 101137523, dated Sep. 25, 2015.
Examination Report from European Patent Appl. No. 10 183 441.4, dated Jul. 29, 2015.
Decision of Patent Grant from Japanese Patent Appl. No. 2012-157890, dated Aug. 18, 2015.
Fifth Office Action from Chinese Patent Appl. No. 200580014868.6, dated Aug. 27, 2015.
Office Action from Taiwanese Patent Appl. No. 103120237, dated Sep. 15, 2015.
Office Action from U.S. Appl. No. 14/025,478, dated Aug. 4, 2015.
Response to OA from U.S. Appl. No. 14/025,478, filed Sep. 22, 2015.
Office Action from U.S. Appl. No. 11/078, dated Sep. 18, 2015.
Office Action from U.S. Appl. No. 10/958,945, dated Oct. 1, 2015.
Notice of Allowance from Chinese Application No. 200580014868.6; Dated Jul. 27, 2016.
Office Action for U.S. Appl. No. 10/958,945; Dated Sep. 23, 2016.
Office Action from Japanese Application No. 2012-107672; Dated Oct. 4, 2016.
Foreign Office Action for Taiwan Application No. 103120237; Dated Oct. 20, 2016.
Foreign Office Action for Japanese Application No. 2015-145765; Dated Nov. 18, 2016.
Office Action for U.S. Appl. No. 14/025,478; Dated Dec. 1, 2016.
Foreign Office Action for European Appl. No. 14734340.4; Dated Jan. 5, 2017.
Foreign Office Action for European Appl. No. 14733486.6; Dated Jan. 5, 2017.
Office Action for U.S. Appl. No. 10/958,945; Dated Jan. 10, 2017.
Foreign Office Action for Application No. 103120237; Dated Jun. 8, 2016.
Office Action from U.S. Appl. No. 11/078,265; Dated Jun. 23, 2016.
Office Action from U.S. Appl. No. 14/025,478; Dated Jul. 5, 2016.
Notice of Allowance for Japanese Application No. 2014-126655; Jul. 5, 2016.
Notice of Allowance for Indian Application No. 6483/DELNP/2006; Aug. 4, 2016.

\* cited by examiner

CASCODE STRUCTURES FOR GAN HEMTS

BACKGROUND OF THE INVENTION

Field of the Invention

The present invention relates to cascode structures and particularly to dual-gate transistors having an insulating layer below one gate.

Description of the Related Art

Materials such as silicon (Si) and gallium arsenide (GaAs) have found wide application in semiconductor devices for low power and, in the case of Si, low frequency applications. However, these more familiar semiconductor materials may not be well-suited for high power and/or high frequency applications, for example, due to their relatively small bandgaps (1.12 eV for Si and 1.42 for GaAs at room temperature) and relatively small breakdown voltages.

In light of the difficulties presented by Si and GaAs, interest in high power, high temperature and/or high frequency applications and devices has focused on wide bandgap semiconductor materials such as silicon carbide (2.996 eV for alpha SiC at room temperature) and the Group III nitrides (e.g., 3.36 eV for GaN at room temperature). These materials, typically, may have higher electric field breakdown strengths and higher electron saturation velocities as compared to GaAs and Si.

A device of particular interest for high power and/or high frequency applications is the High Electron Mobility Transistor (HEMT), which is also known as a modulation doped field effect transistor (MODFET). In a HEMT device, a two-dimensional electron gas (2DEG) may be formed at the heterojunction of two semiconductor materials with different bandgap energies. The smaller bandgap material may have a higher electron affinity than the wider bandgap material. The 2DEG is an accumulation layer in the undoped smaller bandgap material and can contain a relatively high sheet electron concentration, for example, in excess of $10^{13}$ carriers/cm$^2$. Additionally, electrons that originate in the wider bandgap semiconductor may transfer to the 2DEG, allowing a relatively high electron mobility due to reduced ionized impurity scattering. This combination of relatively high carrier concentration and carrier mobility can give the HEMT a relatively large transconductance and may provide a performance advantage over metal-semiconductor field effect transistors (MESFETS) for high-frequency applications.

HEMTs fabricated in the gallium nitride/aluminum gallium nitride (GaN/AlGaN) material system can generate large amounts of RF power due to a combination of material characteristics, such as relatively high breakdown fields, relatively wide bandgaps, relatively large conduction band offset, and/or relatively high saturated electron drift velocity. A major portion of the electrons in the 2DEG may be attributed to polarization in the AlGaN.

Different types of HEMTs in the GaN/AlGaN system have been demonstrated. For example, U.S. Pat. Nos. 5,192,987 and 5,296,395 describe AlGaN/GaN HEMT structures and methods of manufacture. In addition, U.S. Pat. No. 6,316,793, to Sheppard et al., which is commonly assigned with the present application, describes a HEMT device having a semi-insulating silicon carbide substrate, an AlN buffer layer on the substrate, an insulating GaN layer on the buffer layer, an AlGaN barrier layer on the GaN layer, and a passivation layer on the AlGaN active structure. Moreover, U.S. Patent Application Publication No. U.S. 2005/0170574 to Sheppard et al., which is also commonly assigned, describes a HEMT device including a protective layer and/or a low damage recess fabrication technique which may reduce damage to the semiconductor in the gate region of the transistor that can occur during an anneal of the ohmic contacts of the device.

Electron trapping and the resulting difference between DC and RF characteristics can be a limiting factor in the performance of these devices. Silicon nitride (SiN) passivation has been employed to alleviate this trapping problem resulting in high performance devices with power densities over 10 W/mm at 10 Ghz. For example, commonly assigned U.S. Pat. No. 6,586,781 to Wu et al. discloses methods and structures for reducing the trapping effect in GaN-based transistors. However, due to the high electric fields existing in these structures, charge trapping can still be a concern.

Field plates have been used to enhance the performance of GaN-based HEMTs at microwave frequencies and have exhibited performance improvement over non-field-plated devices [See S. Kamalkar and U.K. Mishra, *Very High Voltage AlGaN/GaN High Electron Mobility Transistors Using a Field Plate Deposited on a Stepped Insulator*, Solid State Electronics 45, (2001), pp. 1645-1662]. Many field plate approaches have involved a field plate connected to the gate of the transistor with the field plate on top of the drain side of a channel. This can result in a reduction of the electric field on the gate-to-drain side of the transistor, thereby increasing breakdown voltage and reducing the high-field trapping effect. However, transistors with gate-to-drain field plates can exhibit relatively poor reliability performance, particularly at class C (or higher class) operation where the electric field on the source side of the gate becomes significant. Still other field plate approaches have involved connecting the field plate to the source. Source-connected field plates offer a reduction in gate-to-drain capacitance, which consequently enhances the gain.

In addition to minimizing feedback capacitance, one goal in some applications is to improve linearity (i.e., the degree of proportionality between input and output). While GaN-based HEMTs generally display good linearity, in some applications further improvement is desired (e.g., high power RF or and/or communication applications). One method of minimizing feedback capacitance while also improving linearity involves multi-stage arrangements. Transistors such as HEMTs can be combined in a two-stage cascode arrangement (using two of the same or different transistors). Some cascode arrangements including an initial non-field-plated common source stage and a second field-plated common gate stage are described in the commonly assigned U.S. Pat. No. 7,126,426 to Mishra et al. and entitled "Cascode Amplifier Structure Including Wide Bandgap Field Effect Transistor With Field Plates," which is fully incorporated by reference herein in its entirety. These devices can obtain the benefits of the field plate with little detrimental impact due to the feedback capacitance caused by the use of the field plate.

Figure 1:
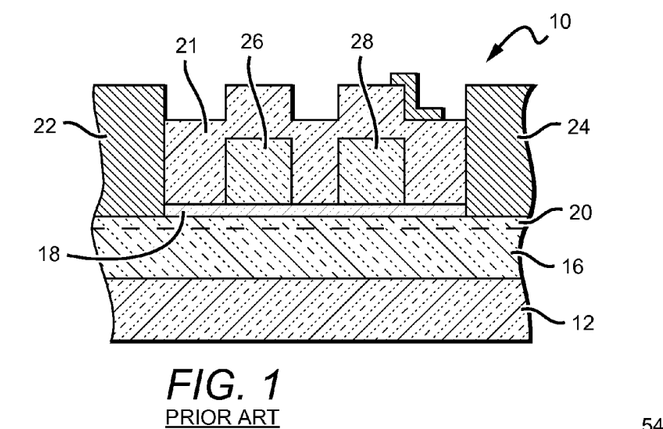
FIG. 1 is a cross-sectional view of one embodiment of a prior art transistor.

Multi-stage arrangements can also be achieved within a single dual-gate transistor, such as those described in U.S. Pat. No. 5,514,992 to Tanaka et al. In a dual-gate cascode transistor, the drain-to-source connection of a two transistor arrangement is replaced by the portion of the transistor between the two gates. FIG. 1 shows a prior art HEMT 10 with a dual-gate cascode arrangement. The HEMT 10 includes a first stage gate 26 and a second stage gate 28 which are on a barrier layer 18 and arranged between a source contact 22 and a drain contact 24 and within an insulating spacer layer 21. The barrier layer 18 is on a layer sequence including a 2DEG 20, a buffer layer 16, and a substrate 12. The second gate 28 can act as a shield for the first gate 26, and thus can reduce the feedback capacitance between the first gate 26 and drain 24, can reduce the drain voltage dependence of the capacitance, and can improve linearity.

In prior art dual-gate arrangements such as that shown in FIG. 1, the first and second stages have the same threshold voltage. If the second gate in such an arrangement is grounded, then the current flow can be limited. Because of this, the second stage must be DC biased so as to avoid limiting the maximum current of the device. Some such devices are described in U.S. Pub. No. 2007/0290762 to Lin et al. However, separately biasing the second stage leads to added complexity and cost.

SUMMARY OF THE INVENTION

The present invention provides dual-gate transistors and/or cascode structures wherein the second stage gate does not need to be separately biased. One embodiment of a multi-gate transistor according to the present invention includes a plurality of active semiconductor layers on a substrate, with a 2DEG at the interface of two of these layers. A first gate is between a source and a drain, and a second gate is between the first gate and the drain. A spacer layer separates the second gate from the plurality of active semiconductor layers.

One embodiment of a cascode structure according to the present invention comprises a first stage with a first gate and a second stage with a second gate. The second gate is separated from a barrier layer by a spacer layer.

One embodiment of an integrated circuit according to the present invention includes a transistor having a plurality of active semiconductor layers on a substrate, with a 2DEG at the interface of two of these layers. A first gate is between a source and a drain, and a second gate is between the first gate and the drain. A spacer layer separates the second gate from the plurality of active semiconductor layers.

These and other further features and advantages of the invention would be apparent to those skilled in the art from the following detailed description, taken together with the accompanying drawings, in which:

DETAILED DESCRIPTION OF THE INVENTION

The present invention provides structures, such as a dual-gate transistor or HEMT cascode structure, that provide lower feedback capacitance and improved linearity at reduced complexity and cost. These structures, such as a GaN-based dual-gate HEMT, can provide high voltage, high current, and high gain operation with improved linearity. The present invention is generally directed to cascode structures wherein a second stage gate is separated from the barrier layer by a relatively thin spacer layer, causing the second stage to have a more negative threshold voltage than the first stage. In one embodiment, the second stage includes a cavity in a spacer layer which exposes the active region; a thin spacer layer is deposited over the active region, and the second stage gate fills the remainder of the cavity. The second stage gate can then be grounded, such as through a connection to the source, and the need for separately biasing the second stage gate is eliminated.

It will be understood that when an element or layer is referred to as being "on", "connected to", "coupled to" or "in contact with" another element or layer, it can be directly on, connected or coupled to, or in contact with the other element or layer or intervening elements or layers may be present. In contrast, when an element is referred to as being "directly on," "directly connected to", "directly coupled to" or "directly in contact with" another element or layer, there are no intervening elements or layers present. Likewise, when a first element or layer is referred to as being "in electrical contact with" or "electrically coupled to" a second element or layer, there is an electrical path that permits current flow between the first element or layer and the second element or layer. The electrical path may include capacitors, coupled inductors, and/or other elements that permit current flow even without direct contact between conductive elements. Further, terms such as "insulating" for example, can refer to materials that are fully insulating, semi-insulating, or that can be either.

It is also understood that, although the ordinal terms first, second, third, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe the relationship of one element to another as illustrated in the drawings. It is understood that relative terms are intended to encompass different orientations of the device in addition to the orientation depicted in the drawings. For example, if the device in one of the drawings is turned over, features described as being on the "lower" side of an element would then be oriented on "upper" side of that element. The exemplary term "lower" can therefore describe both lower and upper orientations, depending of the particular orientation of the device. Similarly, if the device in one of the drawings is turned over, elements described as "below" or "beneath" other elements would then be oriented above those other elements. The exemplary terms "below" or "beneath" can therefore describe both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It is also understood that the term "and/or" as used herein refers to and encompasses any and all possible combinations of one or more of the associated listed items. It will be further understood that the terms "comprises" and "comprising," when used in this specification, specify the presence of stated steps, operations, features, elements, and/or components, but do not preclude the presence or addition of one or more other steps, operations, features, elements, components, and/or groups thereof.

Embodiments of the invention are described herein with reference to cross-section illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. The regions illustrated in the drawings are schematic in nature, and their shapes are not intended to illustrate the actual shape of a region of a device and are not intended to limit the scope of the invention unless explicitly stated otherwise.

Unless otherwise defined, all terms used in disclosing embodiments of the invention, including technical and scientific terms, have the same meaning as commonly understood by one of ordinary skill in the pertinent art and are not necessarily limited to the specific definitions known at the time of the present invention. Accordingly, these terms can include equivalent terms that are created after such time. It is further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein.

Figure 2:
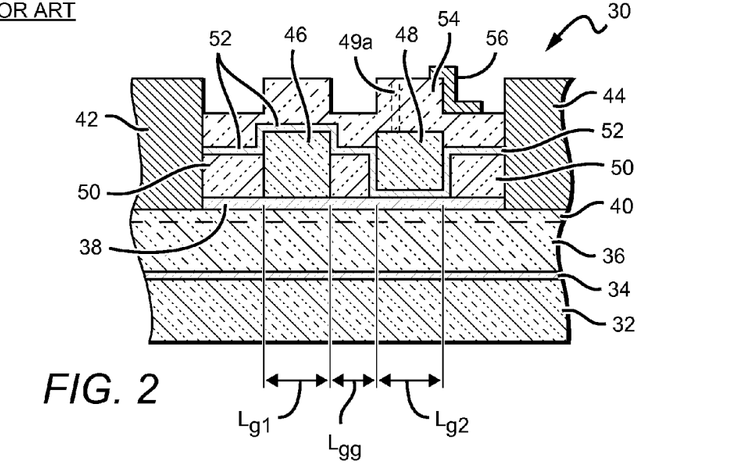
FIG. 2 is a cross-sectional view of one embodiment of a transistor according to the present invention.

FIG. 2 shows one embodiment of a HEMT 30 according to the present invention that is preferably Group-III nitride based, although other material systems can also be used. It should be noted that while the term HEMT is used herein for simplicity, the elements and concepts of the disclosed embodiments can be applied to many different types of transistors, including but not limited to Metal Semiconductor Field Effect Transistors (MESFETs) and Metal Oxide Semiconductor Heterostructure Field Effect Transistors (MOSHFETs). Group III nitrides refer to those semiconductor compounds formed between nitrogen and the elements in the Group III of the periodic table, usually aluminum (Al), gallium (Ga), and indium (In). The term also refers to ternary and tertiary compounds such as AlGaN and AlInGaN.

The HEMT 30 can comprise a substrate 32 which can be made from silicon carbide, sapphire, spinet, ZnO, silicon, gallium nitride, aluminum nitride, or any other material or combinations of materials capable of supporting growth of a Group-III nitride material. A nucleation layer 34 can be formed on the substrate 32 to reduce the lattice mismatch between the substrate 32 and the next layer in the HEMT 30, although this nucleation layer is not mandatory. The nucleation layer 34 can be approximately 1000 angstroms (A) thick, although other thicknesses can be used. The nucleation layer 34 can comprise many different materials, with a suitable material being $Al_zGa_{1-z}N$ (0<=z<=1), and can be formed on the substrate 32 using known semiconductor growth techniques such as Metal Organic Chemical Vapor Deposition (MOCVD), Hydride Vapor Phase Epitaxy (HVPE), or Molecular Beam Epitaxy (MBE).

The substrate 32 can be made of many different materials with a suitable substrate being a 4H polytype of silicon carbide, although other silicon carbide polytypes can also be used including 3C, 6H and 15R polytypes. Silicon carbide has a much closer crystal lattice match to Group III nitrides than sapphire and results in Group III nitride films of higher quality. Silicon carbide also has a very high thermal conductivity so that the total output power of Group III nitride devices on silicon carbide is not limited by the thermal dissipation of the substrate (as may be the case with some devices formed on sapphire). Also, the availability of silicon carbide substrates provides the capacity for device isolation and reduced parasitic capacitance that make commercial devices possible. SiC substrates are available from Cree, Inc., of Durham, N.C. and methods for producing them are set forth in the scientific literature as well as in a U.S. Pat. Nos. Re. 34,861 to Davis et al.; U.S. Pat. No. 4,946,547 to Palmour et al.; and U.S. Pat. No. 5,200,022 to Kong et al.

The formation of a nucleation layer 34 can depend on the material used for the substrate 32. For example, methods of forming a nucleation layer 34 on various substrates are taught in U.S. Pat. No. 5,290,393 to Nakamura and U.S. Pat. No. 5,686,738 to Moustakas, each of which are incorporated by reference as if fully set forth herein. Methods of forming nucleation layers on silicon carbide substrates are disclosed in U.S. Pat. No. 5,393,993 to Edmond et al., U.S. Pat. No. 5,523,589 to Edmond et al., and U.S. Pat. No. 5,739,554 to Edmond et al., each of which is incorporated herein by reference as if fully set forth herein.

The HEMT 30 can further comprise a buffer layer 36 which can have high resistivity formed on the nucleation layer 34. The buffer layer 36 can comprise doped or undoped layers of Group III-nitride materials with a preferred buffer layer 36 made of a Group III-nitride material such as $Al_xGa_yIn_{(1-x-y)}N$ (0<=x<=1, 0<=y<=1, x+y<=1). Other materials can also be used for the buffer layer 36 such as GaN that is approximately 0.5-20 μm thick, and part or all of the buffer layer can be doped with Fe.

A barrier layer 38 is formed on the buffer layer 36 with the buffer layer 36 being sandwiched between the barrier layer 38 and the nucleation layer 34. Like the buffer layer 36, the barrier layer 38 can comprise doped or undoped layers of Group III-nitride materials. The barrier layer can be made of one or multiple layers of $Al_xGa_{1-x}N$ or $Al_xIn_yGa_{1-x-y}N$, where each of x and y ranges from 0-1 with exemplary values being 0, 0.2, 0.4, 0.5, 0.6, 0.8, and 1, and x and y can be a function of depth such that the barrier layer 38 can be a graded layer. A 2DEG channel layer 40 can be induced at the heterointerface between the buffer layer 36 and the barrier layer 38, and the buffer layer 36, 2DEG channel layer 40 and barrier layer 38 can generally form the HEMT active region.

Exemplary HEMT structures are illustrated in U.S. Pat. No. 6,316,793 to Sheppard et al., U.S. Pat. No. 6,586,781 to Wu et al., U.S. Pat. No. 6,548,333 to Smith and U.S. Published Patent Application Nos. 2002/0167023 to Prashant et al., and 2003/0020092 to Parikh et al., each of which is incorporated by reference as though fully set forth herein. Other nitride based HEMT structures are illustrated in U.S. Pat. No. 5,192,987 to Kahn et al. and U.S. Pat. No. 5,296,395 to Kahn et al., each of which is incorporated herein by reference as if fully set forth herein. The buffer and barrier layers 36,38 can be made using the same methods used to grow the nucleation layer 34. Electric isolation between the devices can be accomplished through mesa etch or ion implementation outside the active HEMT.

Source and drain electrodes 42, 44 can be formed in contact with the barrier layer 38. Electric current can flow between the source and drain electrodes 42, 44 through the 2DEG channel layer 40 between the buffer layer 36 and the barrier layer 38 when a gate is biased at the appropriate level. The formation of source and drain electrodes 42, 44 is described in detail in the patents and publications referenced above.

A first stage gate 46 can be formed on the barrier layer 38, and can be at least partially surrounded by and within an aperture of a first spacer layer 50. The first spacer layer 50 can be many different thicknesses, with some exemplary layers being between 100 nm and 2000 nm. A second stage gate 48 can also formed on the barrier layer 38 and within an aperture in the first spacer layer 50.

The gates 46,48 can have many different lengths ($L_{g1}$ and $L_{g2}$), with suitable gate lengths ranging from 10 nm to 1000 nm or approximately 500 nm, although other gate lengths can also be used. In one embodiment, $L_{g1}$ is shorter than $L_{g2}$; in another embodiment, the gate lengths are equal; in another embodiment, $L_{g1}$ is longer than $L_{g2}$. In the embodiment shown, the gates 46,48 can be side by side, which can reduce parasitic capacitance. The gates 46,48 can be separated by a distance $L_{gg}$, which allows the second gate 48 to shield the first gate 46 as previously described. The distance $L_{gg}$ can be many different values, with exemplary distances being between 10 nm and 2000 nm. In some embodiments $L_{gg}$ can range from 600 nm to 1200 nm which can provide easier fabrication, and in some embodiments $L_{gg}$ can be approximately 900 nm.

Figure 3:
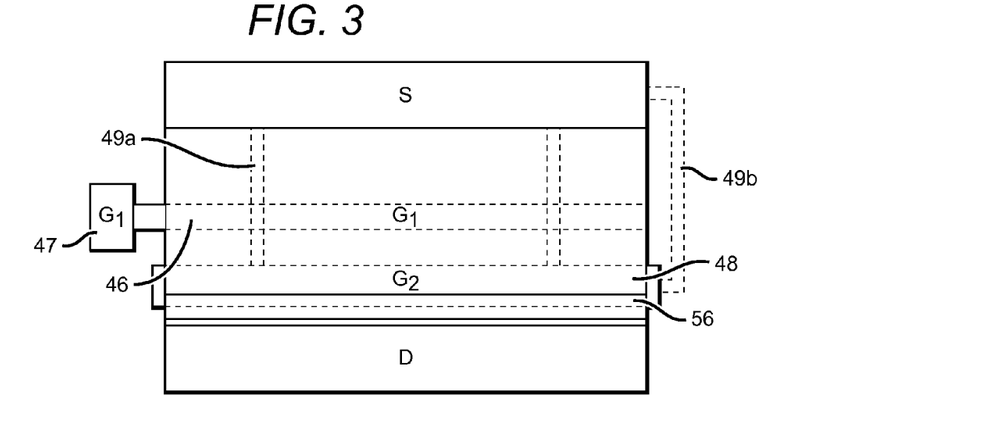
FIG. 3 is a plan view of the transistor shown in FIG. 2.

As best shown in the combination of FIG. 2 and FIG. 3, a plan view of the FIG. 2 embodiment, the first gate 46 can be contacted at a first gate contact 47. In a preferred embodiment, the second gate 48 can be connected to the source 42, although other connections including various ground connections are possible. This connection can be achieved in a number of manners. FIG. 3 shows two such manners, although other manners are possible. The second gate 48 can be connected to the source 42 by a series of conductive vias and/or buses 49a, which run through and/or on a third spacer layer 54 if such a layer is present. The third spacer layer 54 can be many different thicknesses, with one suitable range of thicknesses being approximately 100 nm to 1000 nm and another suitable range being approximately 150 nm to 500 nm, and in some embodiments the second spacer layer 54 can be 300 nm thick. The third spacer layer 54 can cover all of the active region between the drain 44 and source 42, can cover just the portion of the active region between either edge of the second gate 48 and the source 42, can cover just the portion of the active region between the furthest edge of a field plate 56 and the source 42 if such a field plate is present (to be discussed below), or can cover only the surface of the active region needed to support conductive buses (e.g., strips with only a width necessary to support such buses).

The buses of the via/bus system 49a can be on the topmost surface of the HEMT 30. One or more buses can be used, with the FIG. 2 embodiment including two buses. The greater the area covered by the buses, the greater the unwanted capacitance that can be introduced by the buses. The buses can have a sufficient number and width so that current effectively spreads between the source 42 and the second gate 48 while not covering too much of the HEMT active region. In one embodiment, the buses of the via/bus system 49a cover less than all of the HEMT active region. In one embodiment, the second gate 48 and source 42 are connected by a conductive path, such as the via/bus system 49a, covering less than all of the topmost surface of the HEMT 30, in this case the third spacer layer 54.

In one embodiment, the second gate 48 can be connected to the source 42 by a conductive path 49b running outside the active region of the HEMT 30. In the FIGS. 2 and 3 embodiment, the conductive path 49b is on the side opposite the gate contact 47, although in other embodiments the conductive path can be on the same side as the gate contact 47, or there can be two or more conductive paths running on one or both sides of the HEMT 30. Conductive paths running outside the active region can be used in many different embodiments, but can be particularly useful in embodiments where a spacer layer does not cover the active region between the second gate 48 and the source 42 (e.g., an embodiment without the third spacer layer 54). HEMTs according to the present invention can include one or both of the conductive paths 49a,49b shown in the FIGS. 2 and 3 embodiment, or can include other connection means.

In the FIG. 2 embodiment of the present invention, a second spacer layer 52 can be between the second stage gate 48 and the barrier layer 38. The second spacer layer 52 can comprise many different insulating materials, including but not limited to dielectrics. The second spacer layer 52 can comprise the same or different materials than the first spacer layer 50. Some exemplary materials for spacer layers 50,52, 54 include, but are not limited to, SiN, $SiO_2$, Si, Ge, $MgO_x$, $MgN_x$, ZnO, $SiN_x$, $SiO_x$, $TiO_x$, and combinations or layer sequences thereof.

As previously discussed, in prior art dual gate HEMTs the second gate must be separately DC biased, which can lead to excessive expense and difficulty. By including the second spacer layer 52, the threshold voltage of the second gate 48 can be made to different than that of the first gate 46, and in one embodiment can be more negative than the threshold voltage of the first gate 46. Because of this, the second gate 48 can be DC grounded, such as through connecting the second gate 48 to the source 42 as described above. This can eliminate the need for separate biasing of the second gate 48, and thus can eliminate at least some of the cost and manufacturing difficulty of prior art devices. Devices with a layer such as the second spacer layer 52 can also exhibit improved linearity and lower capacitance than prior art HEMTs and/or cascode structures.

The thickness of the second spacer layer 52 can be chosen such that feedback capacitance remains nearly constant over a wide range of drain voltages, while at the same time not limiting the maximum current flow of the device. An insulator that is too thick can lead to inadequate shielding of the first stage and large drain voltage dependence, while an insulator that is too thin can limit the maximum current (and therefore RF power). The second spacer layer 52 can have many different thicknesses. In some embodiments, the thickness can be determined based on the dielectric constant of the material. In some embodiments, the thickness of the second spacer layer 52 ranges from 50 Å to 1500 Å. In other embodiments, the thickness ranges from 100 Å to 800 Å. In another embodiment, the thickness is approximately 400 Å. One embodiment of a second spacer layer 52 according to embodiments of the present invention is a 100 Å to 800 Å and/or approximately 400 Å layer of SiN, $SiO_2$, or a combination thereof. Another embodiment of a second spacer layer 52 according to embodiments of the present invention is an 800-1500 Å layer of $TiO_x$, which has a higher dielectric constant.

The HEMT 30 can be fabricated in many different ways. The first spacer layer 50, second spacer layer 52, and third spacer layer 54 can be deposited using many deposition methods including but not limited to those deposition methods previously mentioned, with preferred methods being plasma chemical vapor deposition (PCVD) and atomic layer deposition (ALD). In one preferred method, the first spacer layer 50 is deposited over the entire top surface between the source 42 and drain 44, and the apertures in which the gates will be deposited are formed, such as by using reactive ion etching (RIE). The first gate 46 can then be formed before the deposition of the second spacer layer 52 over the entire top surface of the HEMT 30 between the source 42 and drain 44. Alternatively, the second spacer layer 52 can be deposited only in the region of the second aperture in which the second gate 48 will be formed, such as depositing the second spacer layer 52 such that it only covers the exposed surface of the barrier layer 38 or only covers the exposed surface of the barrier layer 38 and the side walls of the aperture. The second gate 48 can then be formed in the same aperture as the second spacer layer 52. The third spacer layer 54 can then be formed over the entire top surface of the HEMT 30 between the source 42 and drain 44, or can be deposited selectively in the areas described above.

As previously discussed, one or more field plates can optionally be used and can enhance device performance. Devices according to the present invention, such as the device shown in FIG. 2, are compatible with many different field plate arrangements. Some such field plate arrangements are discussed, for example, in the commonly assigned U.S. Pub. Nos. 2005/0253167, 2005/0253168, and 2006/0202272 to Wu et al., which are all fully incorporated by reference herein in their entirety. In the embodiment of FIGS. 2 and 3, a field plate 56 can be included on the third spacer layer 54 and can overlap the second gate 48. In other embodiments, the HEMT can include a space between the edge of the field plate and the edge of the second gate, or the field plate can cover the entire second gate. Examples of such field plate arrangements are described in the previously mentioned publications. In one embodiment, the field plate can be over the second gate 48 and/or between the second gate 48 and the drain 44. This can minimize the electric field at the edge of the second gate 48. Similar concepts are described in the commonly assigned U.S. Pat. No. 2005/0051800. In other arrangements, a field plate is provided between the source 42 and the first gate 46, over the first gate 46, and/or between the first and second gates 46,48. These field plates can also be used in combination with field plates over the second gate 48 and/or between the second gate 48 and the drain 44.

In a preferred embodiment, the field plate 56 can be connected to the source 42, although other arrangements are contemplated. The field plate 56 can be connected using structures similar to the conductive structure 49*a*,49*b*. For example, the field plate 56 can be connected to the source 42 by conductive buses covering less than all of the third spacer layer 54, a conductive path running outside the active region of the HEMT 30, a combination thereof, or many other conductive structures. Source-connected field plates with examples of appropriate conductive structures are described, for example, in U.S. Pub. No. 2005/0253167. Additionally, the HEMT 30 can include more than one field plate. In one such arrangement, each of the multiple field plates can be either at least partially over the second gate or between the second gate and the drain. Some appropriate multiple field plate structures are described, for example, in U.S. Pub. No. 2005/0253168.

Figure 4:
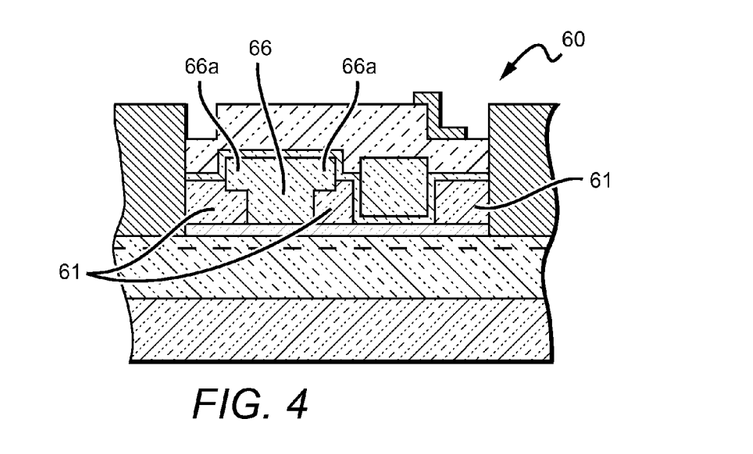
FIG. 4 is a cross-sectional view of another embodiment of a transistor according to the present invention.

While the gates 46,48 shown in FIG. 2 are shown as rectangular, many different gate shapes are possible. FIG. 4 shows an embodiment of an HEMT 60 according to the present invention that includes a T-shaped first gate 66. The gate 66 includes overhanging sections 66*a*. The area below the overhanging sections 66*a* can be left empty, can be partially or entirely filled by a portion of the first spacer layer 61, or can be partially or entirely filled by another material or layer. In the FIG. 4 embodiment, this area can be entirely filled by a portion of the first spacer layer 61. The device 60 with the T-shaped gate 66 can be particularly adapted for high frequency operation. Gate length is an important device dimension in determining device speed, and with high frequency devices gate length is typically shorter. Shorter gate length can lead to high resistance that can negatively impact high frequency operation. By including the overhanging sections 66*a*, the upper portion of the gate 66 has a larger cross-section than the lower portion. This can result in lower resistance and enhanced gate conductance.

Figure 5:
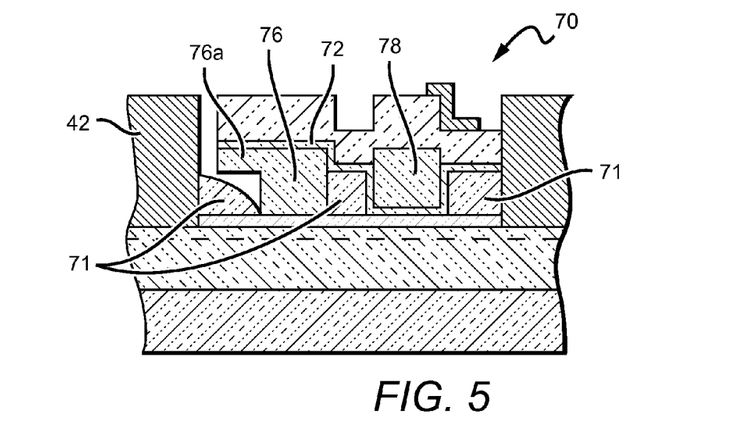
FIG. 5 is a cross-sectional view of another embodiment of a transistor according to the present invention.

FIG. 5 shows an embodiment of an HEMT 70 according to the present invention that includes a gamma shaped first gate 76 instead of the T-shaped gate 66. The area below an overhanging section 76*a* can be left empty, can be filled by a portion of the first spacer layer 71, or can be filled by another material or layer. In the embodiment shown, the space is partially filled by the first spacer layer 71. Including a space below the overhanging section 76*a* can reduce capacitance between the first gate 76 and the source 42.

The overhanging sections 66*a*,76*a* can be made of the same or different materials than the remainder of the gates 66,76, and can be fabricated using many different methods. For example, overhanging sections can be fabricated using photo-resist techniques, and in one embodiment a photo-resist layer can be included on the first spacer layer and the overhanging section(s) formed on the photo-resist layer. Subsequent removal of the photo-resist layer can leave a space between the spacer layer and the overhanging section(s).

While the gates 66 and 76 are generally T-shaped and gamma shaped, respectively, it is understood that many different shapes are possible. One objective of including gates with these shapes is to include a section to improve conductivity to allow for higher frequency operation, with the section being enlarged to achieve this objective. Having a particular shape to the enlarged top portion may not be critical. The length of the overhangs 66*a*,76*a* can vary, with suitable lengths ranging from about 0.2 μm to about 4 μm, although other lengths can also be used. Further, while the embodiments of FIGS. 4 and 5 include T-shaped and gamma shaped first gates 66,76, other embodiments of the present invention include a T-shaped or gamma shaped second gate, or include a T-shaped or gamma shaped first gate and a T-shaped or gamma shaped second gate. If the second gate is T-shaped or gamma shaped, at least the bottom portion which would otherwise be directly on the barrier layer can be covered by a spacer layer 72 similar to or the same as the second spacer layer 52 from FIG. 2.

In addition to the T-shaped and gamma shaped gates 66,76 of FIGS. 4 and 5, many other gate shapes are possible. For example, gates with polygon cross-sections such as hexagonal, octagonal, and trapezoidal gates, for example, are possible. In one embodiment of an HEMT with one or more hexagon gates, the first spacer layer rises to the level of the midpoint of the hexagon. Another shaped gate has one or more overhangs like a T-shaped or gamma shaped gate, with a lower gate portion that tapers inward or outward as it rises to the upper portion of the gate.

Figure 6:
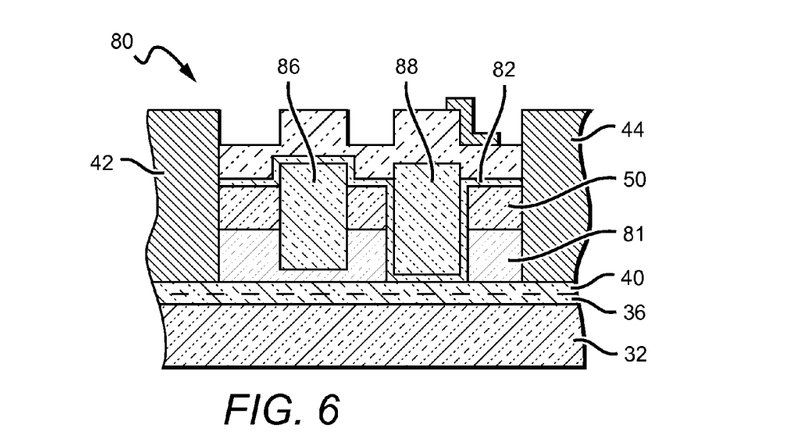
FIG. 6 is a cross-sectional view of another embodiment of a transistor according to the present invention.

Embodiments of HEMTs according to the present invention can also include one or more recessed gates. FIG. shows an embodiment of a transistor according to the present invention similar to the HEMT 30 from FIGS. 2 and 3 (like reference numerals are used to indicate equivalent elements), but with recessed first and second gates 86,88. The gates 86,88 are recessed into the barrier layer 81. This recessed area can be formed at the same time as the apertures in the first spacer layer 50. In this embodiment, the second spacer layer 82 can cover at least the bottom of the second gate 88 and the side portions of the gate 88 within the recess in the barrier layer 81. The second spacer layer 82 can be the same or similar materials and thickness as the second spacer layer 52 from FIGS. 2 and 3. While the gates 86,88 are shown as only partially recessed into the barrier layer 81, each of the gates 86,88 could be fully recessed or different portions could be recessed to different depths in the barrier layer 81. Additionally, the gates 86,88 do not both need to be recessed, or can be recessed differently. Recessed T-shaped gates and gamma shaped gates are also possible, where part or all of the lower portion of the gate (e.g. the portion from the bottom of the overhang(s) and below) can be recessed into the barrier layer.

Figure 7:
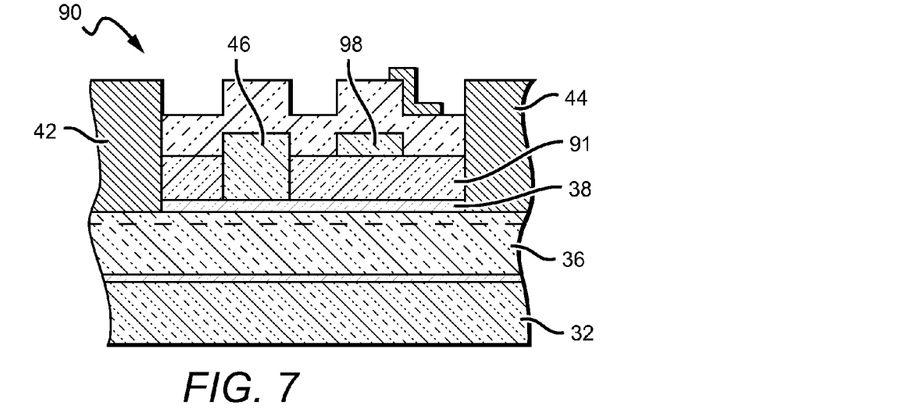
FIG. 7 is a cross-sectional view of another embodiment of a transistor according to the present invention.

FIG. 7 shows another embodiment of a device according to the present invention. The HEMT 90 is similar to the HEMT 30 from FIGS. 2 and 3 in many respects. The HEMT 90 comprises a first gate 46 and a second gate 98. Similar to the first gate in the HEMT 30, the first gate 46 in the HEMT 90 is formed in an aperture in a first spacer layer 91, such that the first gate 46 is in contact with the barrier layer 38. However, in the HEMT 90 the second gate is formed on a top surface of the first spacer layer 91 instead of in an aperture in the first spacer layer 91. The first spacer layer 91 can be made of any of the spacer layer materials previously discussed. The HEMT 90 may produce a higher parasitic capacitance $C_{dg}$ than the HEMT 30 of FIGS. 2 and 3, such as for example at low drain voltages, but can have reduced cost and difficulty of manufacture.

Figure 8:
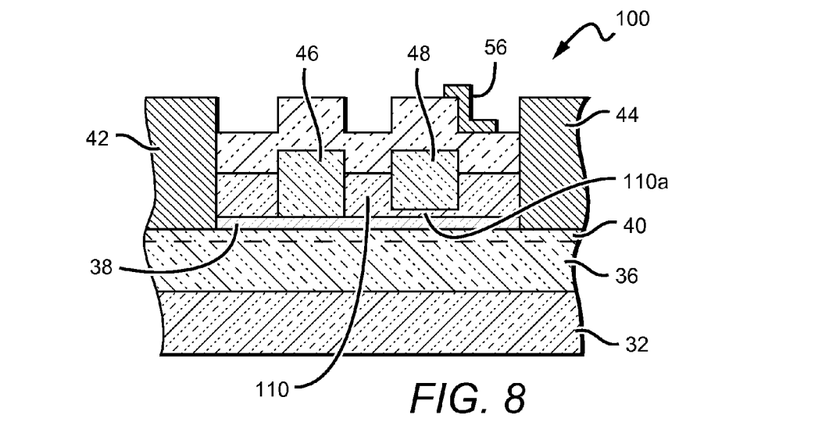
FIG. 8 is a cross-sectional view of another embodiment of a transistor according to the present invention.

FIG. 8 shows another embodiment of a device according to the present invention. The HEMT 100 is similar in many respects to the HEMT 30 shown in FIGS. 2 and 3 and described above. The HEMT 100 comprises a first gate 46 and a second gate 48. However, an insulating layer such as the second spacer layer 52 from FIG. 2 can be excluded from the HEMT 30. The second gate 48 can instead be separated from the barrier layer 38 by a thin section 110*a* of the first spacer layer 110. The first spacer layer 110 can be made of the same materials as the first spacer layer 50 from FIG. 2, and excluding the thin section 110*a* can have the same or similar thickness as the first spacer layer 50. The thin section 110*a* can have the same or similar thickness as the second spacer layer 52 from FIG. 2. One possible manufacturing method of the HEMT 100 includes placing a first gate 46 on or in the barrier layer 38, depositing the first spacer layer 110, and then etching a portion of the first spacer layer 110 to form the thin section 110*a* before depositing the second gate 48 on the thin section 110*a*. Alternatively, the first spacer layer 110 can be deposited before the first gate 46, and an aperture can be etched all the way to the barrier layer 38 to allow for placement of the first gate 46. The first spacer layer 110 can also be partially etched to form a second aperture, with the thin section 110*a* remaining, for placement of the second gate 48. The remainder of the structure can be fabricated as described above.

Figure 9:
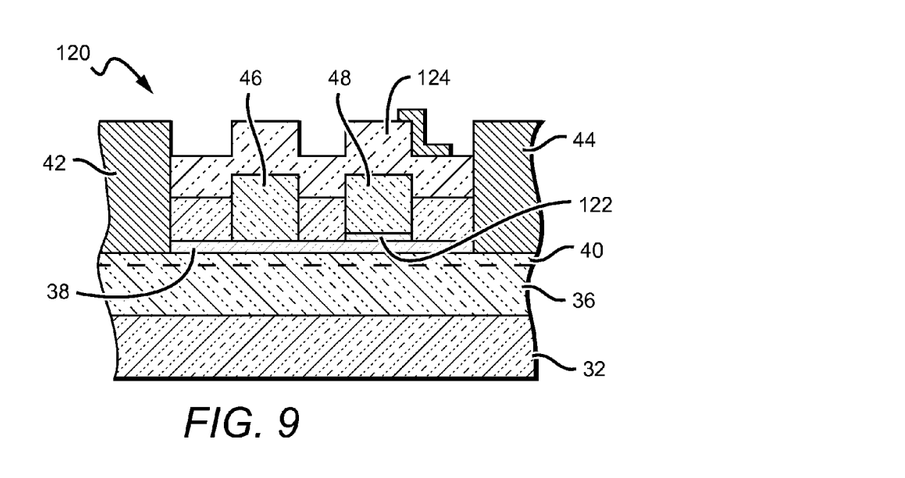
FIG. 9 is a cross-sectional view of another embodiment of a transistor according to the present invention.

FIG. 9 shows another embodiment of a device according to the present invention. The HEMT 120 is similar in many respects to the HEMT 100 shown in FIG. 8 and described above. In this embodiment, a first spacer layer 122 can be deposited in the region where the second gate 48 is to be placed (instead of, for example, depositing the first spacer layer 122 across the entire cross-section from the source 42 to the drain 44). The second gate 48 can then be placed on the first spacer layer 122 and the first gate 46 can be placed on the barrier layer 38. A second spacer layer 124 can then be deposited over both the first and second gates 46,48 with the remainder of the device being fabricated as described above.

While the above embodiments show dual-gate transistor structures, elements of the above embodiments can be applied to other structures. For example, one example of a cascode structure according to the present invention includes a cascode amplifier structure as described in the commonly assigned U.S. Pub. No. 2005/0051800 including two separate single-gate transistors, with a spacer layer similar to the second spacer layer 52 incorporated into the downstream of the two transistors.

The above embodiments and variations thereof can also be utilized in many different ways. For example, the cascode structures can function as amplifiers, similar to those described in U.S. Pat. App. No. 2005/0051800. The above embodiments can also function as part of a larger system. For example, the above embodiments can function within integrated circuits such as monolithic microwave integrated circuits (MMICs).

Many variations of the features of the above embodiments are possible. Transistor structures with features that may be used in embodiments of the present invention are disclosed in the following commonly assigned publications, the contents of each of which are fully incorporated by reference herein in their entirety: U.S. Pat. No. 6,849,882 to Chavarkar et al. and entitled "Group-III Nitride Based High Electron Mobility Transistor (HEMT) With Barrier/Spacer Layer"; U.S. Pat. No. 7,230,284 to Parikh et al. and entitled "Insulating Gate AlGaN/GaN HEMT"; U.S. Pat. No. 7,501,669 to Parikh et al. and entitled "Wide Bandgap Transistor Devices With Field Plates"; U.S. Pat. No. 7,126,426 to Mishra et al. and entitled "Cascode Amplifier Structures Including Wide Bandgap Field Effect Transistor With Field Plates"; U.S. Pat. No. 7,550,783 to Wu et al. and entitled "Wide Bandgap HEMTs With Source Connected Field Plates"; U.S. Pat. No. 7,573,078 to Wu et al. and entitled "Wide Bandgap Transistors With Multiple Field Plates"; U.S. Pat. Pub. No. 2005/0253167 to Wu et al. and entitled "Wide Bandgap Field Effect Transistors With Source Connected Field Plates"; U.S. Pat. Pub. No. 2006/0202272 to Wu et al. and entitled "Wide Bandgap Transistors With Gate-Source Field Plates"; U.S. Pat. Pub. No. 2008/0128752 to Wu and entitled "GaN Based HEMTs With Buried Field Plates"; U.S. Pat. Pub. No. 2010/0276698 to Moore et al. and entitled "Gate Electrodes For Millimeter-Wave Operation and Methods of Fabrication; U.S. Pat. Pub. No. 2012/0049973 to Smith, Jr. et al. and entitled "High Power Gallium Nitride Field Effect Transistor Switches"; and U.S. Pat. Pub. No. 2012/0194276 to Fisher and entitled "Low Noise Amplifiers Including Group III Nitride Based High Electron Mobility Transistors."

It is understood that the above arrangements can be applied to other transistors beyond HEMTs, including MESFETs and Metal Oxide Semiconductor Heterostructure Field Effect Transistor (MOSHFET), whether these transistors are discrete dual-gate transistors or part of a larger structure. The arrangements can also be applied to microwave and millimeter-wave power amplifiers for communication, instrumentation, military applications and so forth, including but not limited to monolithic microwave integrated circuits (MMICs).

Although the present invention has been described in considerable detail with reference to certain preferred configurations thereof, other versions are possible. The buried field plate and gate arrangement can be used in many different devices. The field plates and gates can also have many different shapes and can be connected to the source contact in many different ways. Accordingly, the spirit and scope of the invention should not be limited to the preferred versions of the invention described above.

We claim:

1. A multi-gate transistor, comprising:
   a plurality of active semiconductor layers on a substrate;
   a two-dimensional electron gas (2DEG) at the interface of two of said active semiconductor layers;
   a source and a drain in electrical contact with said 2DEG;
   a first spacer layer;
   a first gate between said source and drain and directly on said plurality of active semiconductor layers, said first gate in electrical contact with one or more of said plurality of active semiconductor layers;
   a second gate between said first gate and said drain, said first and second gates within respective apertures in said first spacer layer; and
   a second spacer layer between said second gate and said plurality of active semiconductor layers.

2. The multi-gate transistor of claim 1, wherein said second spacer layer comprises a dielectric material.

3. The multi-gate transistor of claim 1, wherein the thickness of said second spacer layer is approximately 100 Å to 800 Å.

4. The multi-gate transistor of claim 1, wherein said first spacer layer is shaped to define first and second apertures;
   wherein a portion of said plurality of active semiconductor layers is exposed through each of said first and second apertures.

5. The multi-gate transistor of claim 4, wherein said portion exposed through said second aperture is covered by said second spacer layer.

6. The multi-gate transistor of claim 5, wherein said second spacer layer is thinner than said first spacer layer.

7. The multi-gate transistor of claim 1, further comprising a first field plate.

8. The multi-gate transistor of claim 7, wherein said first field plate is over said second gate.

9. The multi-gate transistor of claim 7, wherein said first field plate is connected to said source.

10. The multi-gate transistor of claim 1, wherein said second gate is connected to said source.

11. The multi-gate transistor of claim 10, wherein said second gate is connected to said source by one or more conductive paths;
    wherein said one or more conductive paths collectively cover less than all of the topmost surface of said multi-gate transistor between said second gate and said source.

12. The multi-gate transistor of claim 1, wherein said second gate is longer than said first gate.

13. The multi-gate transistor of claim 1, wherein at least one of said first gate and said second gate comprises an overhanging section.

14. The multi-gate transistor of claim 1, wherein said second gate is at least partially recessed into at least one of said plurality of active semiconductor layers; and
    wherein said second spacer layer separates all of the recessed portion of said second gate from said plurality of active semiconductor layers.

15. The multi-gate transistor of claim 1, wherein said multi-gate transistor has a first stage and a second stage; and
    wherein said second stage has a more negative threshold voltage than said first stage.

16. The multi-gate transistor of claim 1, wherein said transistor is a high electron mobility transistor (HEMT).

17. A cascode structure, comprising:
    a plurality of active semiconductor layers;
    a first stage comprising a first gate; and
    a second stage comprising a second gate, said first and second gates within respective apertures in a first spacer layer;
    wherein said first gate is in electrical contact with one or more of said plurality of active semiconductor layers;
    wherein said second gate is separated from said plurality of active semiconductor layers by a second spacer layer, said second spacer layer below said second gate and above said first gate; and
    wherein said second stage has a more negative threshold voltage than said first stage.

18. The cascode structure of claim 17, wherein the thickness of said spacer layer is approximately 100 Å to 800 Å.

19. The cascode structure of claim 17, wherein said cascode structure is an amplifier.

20. An integrated circuit comprising a transistor, said transistor comprising:
    a plurality of active semiconductor layers on a substrate;
    a two-dimensional electron gas (2DEG) at the interface of two of said active semiconductor layers;
    a source and a drain in contact with said 2DEG;
    a first spacer layer;
    a first gate between said source and drain and directly on said plurality of active semiconductor layers, said first gate in electrical contact with one or more of said plurality of active semiconductor layers;
    a second gate between said first gate and said drain, said first and second gates within respective apertures in said first spacer layer;
    a second spacer layer between said second gate and said plurality of active semiconductor layers; and
    a third spacer layer over said second spacer layer and over said first and second gates.

21. The integrated circuit of claim 20, further comprising a field plate on said third spacer layer.

22. The multi-gate transistor of claim 1, wherein said first gate has top and bottom surfaces, said bottom surface directly on said plurality of active semiconductor layers, and
    wherein said second spacer layer between said second gate and said plurality of active semiconductor layers extends over the top surface of said first gate.

* * * * *